US011960718B2

(12) United States Patent
Valencia Rissetto et al.

(10) Patent No.: US 11,960,718 B2
(45) Date of Patent: Apr. 16, 2024

(54) METHOD OF DATA MANAGEMENT FOR A BITWISE PROGRAMMABLE NON-VOLATILE MEMORY, AND CORRESPONDING DEVICE

(71) Applicants: STMICROELECTRONICS (GRENOBLE 2) SAS, Grenoble (FR); STMICROELECTRONICS S.r.l., Agrate Brianza (IT)

(72) Inventors: Leonardo Valencia Rissetto, Montbonnot (FR); Francesco Tomaiuolo, Acireale (IT); Diego De Costantini, Augusta (IT)

(73) Assignees: STMICROELECTRONICS (GRENOBLE 2) SAS, Grenoble (FR); STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 17/721,933

(22) Filed: Apr. 15, 2022

(65) Prior Publication Data
US 2022/0334720 A1 Oct. 20, 2022

(30) Foreign Application Priority Data
Apr. 20, 2021 (FR) ...................... 2104087

(51) Int. Cl.
*G06F 12/00* (2006.01)
*G06F 3/06* (2006.01)
*G06F 13/00* (2006.01)

(52) U.S. Cl.
CPC .......... *G06F 3/0604* (2013.01); *G06F 3/0655* (2013.01); *G06F 3/0679* (2013.01)

(58) Field of Classification Search
CPC ..... G06F 3/0604; G06F 3/0655; G06F 3/0679
USPC ........................................................ 711/154
See application file for complete search history.

(56) References Cited

U.S. PATENT DOCUMENTS

| | | | | |
|---|---|---|---|---|
| 5,557,568 A | * | 9/1996 | Miyamoto | G11C 7/1048 365/185.11 |
| 5,873,112 A | * | 2/1999 | Norman | G11C 16/10 257/E27.103 |
| 6,029,046 A | * | 2/2000 | Khan | H04N 7/1675 348/E7.063 |

(Continued)

FOREIGN PATENT DOCUMENTS

EP 2048668 A1 4/2009

*Primary Examiner* — Sheng Jen Tsai
(74) *Attorney, Agent, or Firm* — Seed IP Law Group LLP

(57) ABSTRACT

In response to a request to store new data at a memory location of a bitwise programmable non-volatile memory, data stored at the memory location of the bitwise programmable memory is sensed. The bits of the sensed data are compared with bits of the new data. An indication of a cost difference is determined between a first burst of bitwise programming operations associated with programming bits of the new data which are different from bits of the sensed data, and a second burst of bitwise programming operations associated with programming bits of a complementary inversion of the new data which are different from bits of the sensed data. One of the first burst of bitwise programming operations or the second burst of bitwise programming operations is executed based on the generated indication of the cost difference.

28 Claims, 6 Drawing Sheets

(56) References Cited

U.S. PATENT DOCUMENTS

| | | | | |
|---|---|---|---|---|
| 6,292,868 | B1* | 9/2001 | Norman | G11C 16/10 |
| | | | | 713/320 |
| 6,370,058 | B1* | 4/2002 | Fukumoto | G11C 14/00 |
| | | | | 365/185.08 |
| 7,920,413 | B2* | 4/2011 | Yu | G11C 7/1006 |
| | | | | 365/163 |
| 10,937,495 | B2* | 3/2021 | Chao | G11C 13/004 |
| 2001/0008281 | A1* | 7/2001 | Niimi | G11C 7/20 |
| | | | | 257/1 |
| 2002/0054505 | A1* | 5/2002 | Micheloni | G11C 11/5621 |
| | | | | 365/185.03 |
| 2005/0002235 | A1* | 1/2005 | Kaneda | G11C 16/0425 |
| | | | | 365/185.14 |
| 2007/0114956 | A1* | 5/2007 | Hashimoto | H02P 4/00 |
| | | | | 318/139 |
| 2008/0175034 | A1* | 7/2008 | Hagiwara | G11C 7/1006 |
| | | | | 365/189.14 |
| 2008/0219047 | A1* | 9/2008 | Yu | G11C 13/0069 |
| | | | | 365/163 |
| 2012/0254549 | A1* | 10/2012 | Hutchison | G06F 12/0246 |
| | | | | 711/E12.04 |
| 2018/0018104 | A1* | 1/2018 | Farahani | G11C 11/1693 |
| 2020/0081802 | A1* | 3/2020 | Solihin | G06F 11/1004 |
| 2021/0005255 | A1* | 1/2021 | Chao | G11C 13/003 |
| 2021/0279188 | A1* | 9/2021 | Goss | G06F 11/3423 |

* cited by examiner

METHOD OF DATA MANAGEMENT FOR A BITWISE PROGRAMMABLE NON-VOLATILE MEMORY, AND CORRESPONDING DEVICE

BACKGROUND

Technical Field

Embodiments are related to data management for a bitwise programmable non-volatile memory, such as for example a phase change memory "PCM," a metal oxide resistive memory "OxRAM," or a magnetoresistive memory "MRAM."

Description of the Related Art

Parallel to the dominant non-volatile memory technologies that are based on floating gate transistors, typically Flash memories, the industry is moving to "new" type of memories, usually called resistive memories, such as OXRAM, MRAM and PCM, for instance for scaling and cost reasons.

Unlike memories based on floating gate transistors, this new type of memories typically has the advantage of being bitwise programmable, to be alterable by one bit at a time.

The drawback of the bitwise programmable ability of resistive memories is that it can take a longer time to program at once a sequence of data, bit by bit or few bits per few bits.

Resistive memories, for example of the PCM type, classically have a longer programming time, in particular due to the fact that the amount of current required to modify one bit limits the number of bits able to be changed at once.

Similarly, the programming operations in resistive memories typically consume large amounts of energy.

However, there are several situations when it is desirable to change a large portion of the memory, such as for example in case of a firmware update in a microcontroller "MCU," or in case of destroying contents because of a security breach.

Classical solutions to cope with this problem of programming duration related to energy consumption introduce drawbacks affecting competitiveness, particularly in matters of costs and footprint. For example, increasing the available current classically needs bigger transistors and a bigger charge pump, and providing an external current source results in a larger device or a non-autonomous device. Also, increasing the level of parallelism, dividing the memory array into smaller sub-arrays and programing several sub-arrays in parallel, reduces the voltage drop in one sub-array given that enough current is provided, but introduces a larger peripheral area.

BRIEF SUMMARY

According to an aspect, it is proposed a method of data management for a bitwise programmable non-volatile memory, such as a resistive memory, for example a phase change memory, comprising storing new data at a memory location of a memory word, said storing comprising:
 a sensing step comprising sensing former data stored in the memory location;
 a decision step comprising:
  computing a first quantification of a first burst of bitwise programming operations corresponding to the bits of the new data respectively different than the bits of the former data,
  computing a second quantification of a second burst of bitwise programming operations corresponding to the bits of a complementary inversion of the new data, respectively different than the bits of the former data,
  testing whether the first quantification is higher than the second quantification; and
 a programming step comprising, if the test of the decision step is true, bitwise programming the bits of the complementary inversion of the new data respectively different than the bits of the former data, and programming or keeping an inversion flag dedicated to the memory word at a flagged value.

Firstly, because of the bitwise programing ability of the non-volatile memory, only the bits in the new data that are different than the already stored bits in the memory location are selectively programmed. The common bits of the former data are kept unchanged, thus saving some programming operations.

Secondly, the first and the second quantification of the bitwise programming operations are representations of the number of bits to change in the former data to result in the new data, or, respectively, to result in the complementary inversion of the new data.

Computing these quantifications permits to test whether programming the complementary inversion of the new data is faster in time and less energy consuming than programming the non-inverted new data.

If the new data is programmed in its complementary inverted form, then the inversion flag programmed at the flagged value indicates that the meaning of the data stored is complementary inverted. If the inversion flag was already programmed at the flagged value, then the inversion flag is not programmed in order to keep it at the flagged value.

Consequently, the method according to this aspect allows the new data to be programmed according to the faster method, saving from 50% to 100% of the programming duration, together with reducing power consumption accordingly.

As a simplified demonstration, it is suggested to focus on the worst case and the average case, classically the worst case being when 100% of the bits of the former data have to flip in order to result in the new data, while the average case is when 50% of the bits have to flip. With the method according to this aspect, when the classical worst case happens, for instance programming 0xFF of new data instead of 0x00 of former data, then complementary inverting the new data results in zero programming operations except for programming the inversion flag. It is then easily understandable that the worst case with the method according to this aspect is 50% of the bits to flip in the memory location, which corresponds to the classical average case.

This simplified demonstration, based on the number of bits having to flip, shows a reduction in the programming duration when both types of bit flip (flipping from 0 to 1 and from 1 to 0) have the same duration. This is the case for example when the bit states are stored in a differential manner as defined hereinafter.

However, flipping a bit from 0 to 1 ("setting" a bit) and flipping a bit from 1 to 0 ("resetting" a bit) can have different durations. This is the case for example when the bit states are stored in an absolute manner as defined hereinafter.

According to an embodiment, each bitwise programming operation comprises using a set pulse having a set pulse duration or using a reset pulse having a reset pulse duration, and computing the first quantification and the second quantification each comprise counting the number of set pulses and of resets pulses among the respective first burst and second burst of bitwise programming operations, and calculating the respective quantification values proportional to the accumulated durations of the bitwise programming operations in each respective burst.

In other words, this embodiment allows a difference in the duration of a set pulse versus a reset pulse to be taken into account, on the basis of a simple to implement proportional calculation based on a count of the number of set and reset pulses in the bits to changes in the former data to result in the new data or in the complementary inverted new data.

The quantification values proportional to the accumulated durations can be obtained for instance by adding the count value of the shorter (or resp. longer) pulse to the count value of the longer (or resp. shorter) pulse multiplied by a duration factor.

Thus, if the complementary inverted new data needs more programming operations that present a shorter cumulated duration than the programming operations needed for the non-inverted new data, the fastest and least power-consuming programming step is performed.

According to an embodiment, computing the first quantification and the second quantification takes into account the programming operation of the inversion flag.

According to an embodiment, when the memory location size is smaller than the memory word size and when the inversion flag dedicated to the memory word has to be programmed, computing the first quantification and the second quantification takes into account the programming operations for inverting of all the other bits belonging to the memory word outside of the memory location; and the programming step comprises programming all these other bits at their complementary inverted state.

According to an embodiment, each bit state is stored in an absolute manner having a set state or a reset state.

According to an embodiment, each bit state is stored in a differential manner using an oriented pair of complementary states, each programming operation comprising using both a set pulse and a reset pulse, and wherein the decision step is replaced by an equivalent simplified decision step comprising:
  counting a first number of respectively different bits between the new data and the former data, and
  testing whether the first number is higher than 50% of the size of the memory word.

In case of storing the bits in a differential manner, each programming operation including a set pulse and a reset pulse, the duration of each programming operation is thus the same. Accordingly, instead of computing the quantifications representing the accumulated durations of the respective programming operations, the simple count of the number of bits to change in the former data to result in the new data allows selection of the faster programming step.

According to an embodiment, the method comprises reading data stored at a memory location of a memory word, the reading comprising sensing the bits of the data stored in the memory location and, if the inversion flag dedicated to the memory word has the flagged value, inverting each bit of the sensed data to the respective complementary bits.

According to an embodiment, sensing data comprises an error correction code algorithm performed on the data stored in the memory location and on the dedicated inversion flag, and executed before inverting the bit states of the sensed data.

According to an embodiment, the programming step comprises, if the test of the computing step is not true, bitwise programming only the bits of the new data that are different than the respective bits of the former data, together with programming or keeping the inversion flag dedicated to the memory word at a non-flagged value.

According to another aspect, it is proposed an integrated circuit including a bitwise programmable non-volatile memory, comprising data management means configured to store new data at a memory location of a memory word, said data management means comprising:
  a sensing circuit configured to sense former data stored in the memory location;
  a decision calculator circuit configured:
    to compute a first quantification of a first burst of bitwise programming operations corresponding to the bits of the new data respectively different than the bits of the former data,
    to compute a second quantification of a second burst of bitwise programming operations corresponding to the bits of a complementary inversion of the new data, respectively different than the bits of the former data,
    to test whether the first quantification is higher than the second quantification; and
  a programming circuit configured, if the test of the decision calculator circuit is true, to bitwise program the bits of the complementary inversion of the new data respectively different than the bits of the former data, and to program or to keep an inversion flag dedicated to the memory word at a flagged value.

According to an embodiment, the programming circuit is configured, for each bitwise programming operation, to use a set pulse having a set pulse duration or a reset pulse having a reset pulse duration, and wherein the decision calculator circuit is configured, for computing the first quantification and the second quantification, to count the number of set pulses and of resets pulses among the respective first burst and second burst of bitwise programming operations, and to calculate the respective quantification values proportional to the accumulated durations of the bitwise programming operations in each respective burst.

According to an embodiment, the decision calculator circuit is configured to compute the first quantification and the second quantification taking into account the programming operation of the inversion flag.

According to an embodiment, when the memory location size is smaller than the memory word size and when the inversion flag dedicated to the memory word has to be programmed, the decision calculator circuit is configured to compute the first quantification and the second quantification taking into account the programming operations for inverting of all the other bits belonging to the memory word outside of the memory location; and the programming circuit is configured to program all these other bits at their complementary inverted state.

According to an embodiment, the non-volatile memory is configured to store each bit state in an absolute cell adapted to have a set state or a reset state.

According to an embodiment, the non-volatile memory is configured to store each bit state in a pair of differential cells adapted to store an oriented pair of complementary states, the programming circuit being configured to use both a set pulse and a reset pulse for each bitwise programming operation, and wherein the configuration of the decision calculator circuit is replaced by an equivalent simplified configuration adapted:
  to count a first number of respectively different bits between the new data and the former data, and to test whether the first number is higher than 50% of the size of the memory word.

According to an embodiment, the data management means comprises a reading circuit configured to sense the bits of the data stored at a memory location of a memory word, and, if the inversion flag dedicated to the memory word has the flagged value, to invert each of the sensed bit to the respective complementary bit.

According to an embodiment, the reading circuit comprises an error correction code mechanism configured to be performed on the data stored in the memory word and on the dedicated inversion flag, and to be executed before inverting the sensed bits.

According to an embodiment, the programming circuit is configured, if the test of the decision calculator circuit is not true, to bitwise program only the bits of the new data that are different than the respective bits of the former data, together with programming or keeping the inversion flag dedicated to the memory word at a non-flagged value.

In an embodiment, a method comprises responding to a request to store new data at a memory location of a bitwise programmable non-volatile memory. Data stored at the memory location of the bitwise programmable memory is sensed. The bits of the sensed data are compared with bits of the new data. An indication of a cost difference is determined between a first burst of bitwise programming operations associated with programming bits of the new data which are different from bits of the sensed data, and a second burst of bitwise programming operations associated with programming bits of a complementary inversion of the new data which are different from bits of the sensed data. One of the first burst of bitwise programming operations or the second burst of bitwise programming operations is executed based on the generated indication of the cost difference.

In an embodiment, a device comprises: a bitwise programmable non-volatile memory array; and memory management circuitry coupled to the bitwise programmable memory array, wherein the memory management circuitry, in operation: receives a request to store new data at a memory location of the bitwise programmable non-volatile memory array; senses data stored at the memory location of the bitwise programmable memory array; compares bits of the sensed data with bits of the new data; generates an indication of a cost difference between: a first burst of bitwise programming operations associated with programming bits of the new data which are different from bits of the sensed data; and a second burst of bitwise programming operations associated with programming bits of a complementary inversion of the new data which are different from bits of the sensed data; and executes one of the first burst of bitwise programming operations or the second burst of bitwise programming operations based on the generated indication of the cost difference.

In an embodiment, a system, comprises: a processing device; and a bitwise programmable non-volatile memory coupled to the processing device and including memory management circuitry. The memory management circuitry, in operation, responds to a request from the processing device to store new data at a memory location of the bitwise programmable non-volatile memory by; sensing data stored at the memory location of the bitwise programmable memory; comparing bits of the sensed data with bits of the new data; generating an indication of a cost difference between: a first burst of bitwise programming operations associated with programming bits of the new data which are different from bits of the sensed data; and a second burst of bitwise programming operations associated with programming bits of a complementary inversion of the new data which are different from bits of the sensed data; and executing one of the first burst of bitwise programming operations or the second burst of bitwise programming operations based on the generated indication of the cost difference.

In an embodiment, a non-transitory computer-readable medium's contents cause a memory management circuit to perform a method, the method comprising: receiving a request to store new data at a memory location of a bitwise programmable non-volatile memory; sensing data stored at the memory location of the bitwise programmable memory; comparing bits of the sensed data with bits of the new data; generating an indication of a cost difference between: a first burst of bitwise programming operations associated with programming bits of the new data which are different from bits of the sensed data; and a second burst of bitwise programming operations associated with programming bits of a complementary inversion of the new data which are different from bits of the sensed data; and executing one of the first burst of bitwise programming operations or the second burst of bitwise programming operations based on the generated indication of the cost difference.

BRIEF DESCRIPTION OF THE SEVERAL VIEWS OF THE DRAWINGS

Other advantages and features of the disclosure shall appear from an examination of the detailed description of non-limitative embodiments of the disclosure, and of the drawings annexed thereto on which.

DETAILED DESCRIPTION

Figure 1:
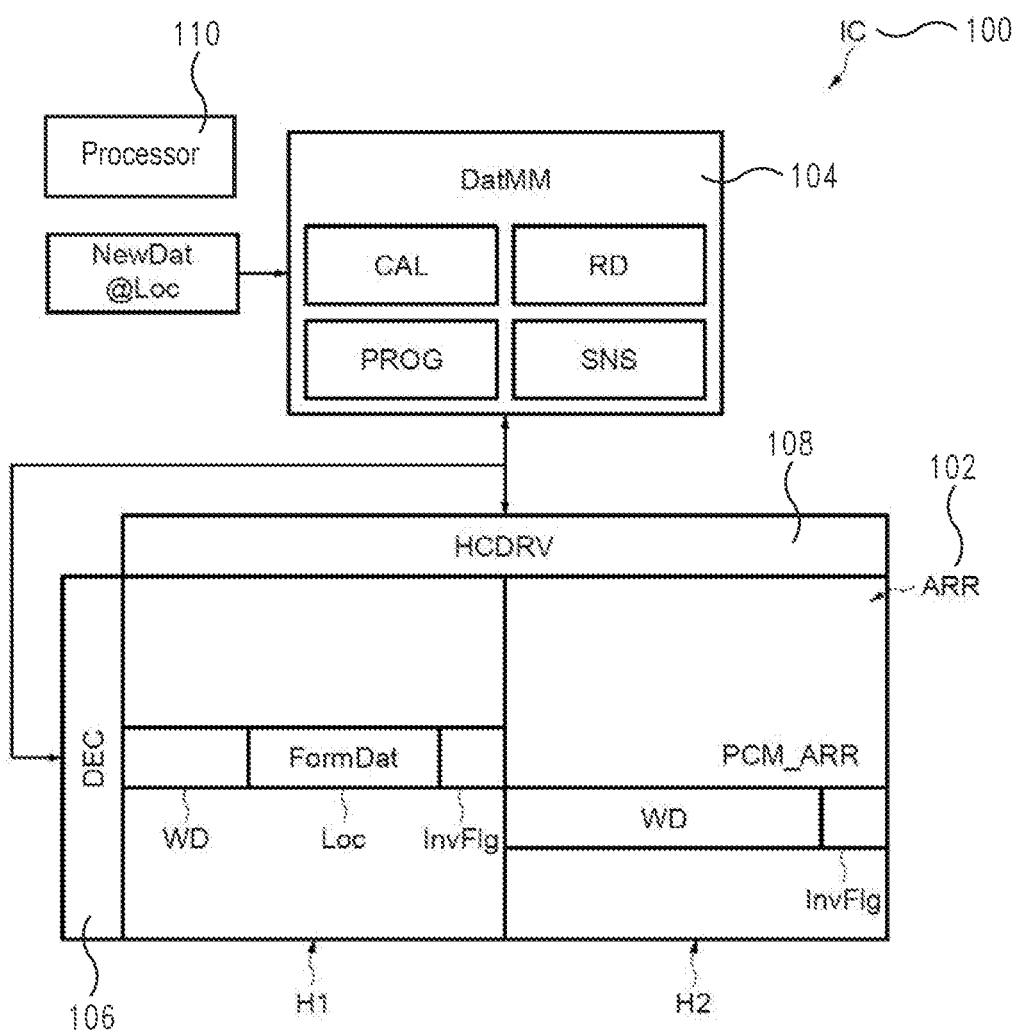
FIG. 1 illustrates an example embodiment of an integrated circuit including a bitwise programmable memory.

FIG. 1 illustrates an example of an integrated circuit IC 100 including a bitwise programmable non-volatile memory. A bitwise programmable non-volatile memory has the ability to program one bit at a time, independently from the organization of the non-volatile memory cells in an array ARR 102, such as typical organization in bytes or memory words.

The memory array ARR 102 includes memory cells each adapted to store one bit of data and arranged in rows and columns.

The bitwise programmable ability belongs, for example, to resistive non-volatile memories, such as phase change memories "PCM," metal oxide resistive memories "OxRAM," or magnetoresistive memories "MRAM."

Conventionally, a bit is a binary value that can have two states, usually designated by numbers 0 and 1, bytes are groups of eight bits, and the term memory word designate sections of data that can be read at once.

A row typically contains a plurality of words, and the decoder circuits DEC and driver circuits HCDRV are able to select one row and one word inside the row.

The bitwise programmable non-volatile memory IC comprises the memory array ARR and data management means or circuitry DatMM 104.

Each resistive memory cell includes a resistive material having two states, namely designated "set state" traditionally storing a "1" and "reset state" traditionally storing a "0." Each state of the resistive material has a different electrical resistance, the value of which is used as the value of the respective bit (e.g., "0" for the highest resistance and "1" for the lowest resistance).

In the example of phase change memories "PCM," the two-state resistive material may be in a crystalline phase or an amorphous phase, to which the two different resistance values correspond. The transition from the crystalline phase to the amorphous phase, and vice versa, is obtained by an appropriate change of temperature, obtained by the passage of a pulse of current. In particular, and as it will be detailed later in relation with FIG. 2, the amorphous phase (e.g., reset state) is obtained with a short rectangular current pulse while the crystalline phase (e.g., set state) is obtained with a longer current pulse with a triangular shape.

In the example of metal oxide resistive memories "OxRAM," the two-state resistive material may be a dielectric, which is natively insulating, that can be made to conduct through a filament or conduction path formed after application of a sufficiently high voltage. Once the filament is formed, it may be reset (broken, resulting in high resistance) or set (re-formed, resulting in lower resistance) by respective voltage pulses.

In the example of magnetoresistive memories "MRAM," the two-state resistive material may be obtained by tunnel magnetoresistance, the cell being formed from two ferromagnetic plates each capable of holding a magnetization and separated from each other by a thin insulating layer. The electrical resistance of the cell changes with the relative orientation of the magnetization in the two ferromagnetic plates. One of the two plates has a permanent magnetization orientation, while the magnetization orientation of the other plate can be changed to match the orientation of an external field, for instance a magnetic field induced by a current flowing through write lines in two possible directions.

In addition, each resistive memory cell can be made in two possible manners, an "absolute manner," also called "one cell one bit" where a bit is stored in one respective cell having either a set state or a reset state; or a "differential manner," also called "two cells one bit" where a bit is stored in an oriented pair of cells, each storing a complementary states (for instance "0-1" to mean "0" and "1-0" to mean "1").

In this example, the memory array 102 is additionally "parallelized" (or "divided") in two equal portions H1, H2, which divides by two the size of the rows and thus also limits the size of the words. The array can be divided in more than two smaller equal portions. The "parallelization" technique provides flexibility to manage the data in the array.

Selecting and accessing a memory cell is performed by decoder circuits DEC 106, typically row and column decoders, and programming operations (that will be specified later in relation with FIG. 2) are performed by driver circuits HCDRV 108, typically high current driver circuits.

Each memory word WD includes a dedicated inversion flag InvFlg that permits to mark the reading of the data that are stored in the corresponding memory word WD. The inversion flag InvFlg can have a non-flagged value meaning that the data must be read according to the conventional manner, for example typically a reset state of a cell translating to "0" and a set state of a cell translating to "1"; or a flagged value meaning that the data must be read in a complementary inverted manner, according to the same typical example, a reset state of a cell translating to "1" and a set state of a cell translating to "0."

This mechanism of the inversion flag InvFlg reduces the number of programming operations while storing new data NewDat, and thus to save programming time as well as energy.

The inversion flag InvFlg can be coded on one bit, the non-flagged value being "0" and the flagged value being "1," for example. In order to avoid a false inversion of the stored data due to an error in the inversion flag InvFlg, the inversion flag can be "protected" for example by being included in an error correction code mechanism, or by retaining the majority among three bits coding the inversion flag, or other known techniques.

The data management means DatMM are configured to store new data NewDat at a memory location Loc belonging to a memory word WD and comprise a sensing circuit SNS, a logical unit circuit called decision calculator circuit CAL, a programming circuit PROG and a reading circuit RD.

The data management means DatMM are configured to perform the method of data management as described later in relation with FIGS. 3 to 6.

In response to receiving a command including new data NewDat and the memory location Loc to store it at, the data management means DatMM perform the storing process.

During the storing process, the sensing circuit SNS is configured to sense the former data FormDat stored in the memory location Loc. For this purpose, the sensing circuit SNS can control the decoder circuits DEC and the driver circuits HCDRV.

The decision calculator circuit CAL is configured to identify the bits in the new data that are different than the already stored bits in the memory location, for instance thanks to a bitwise comparison between the new data NewDat and the sensed former data FormDat.

This will allow the bits of the former data FormDat common to the new data NewDat to remain unchanged and thus to perform a burst of programming operations only for the bits that are different in the new data NewDat compared to the bits of the former data FormDat.

In addition, the decision calculator circuit CAL is configured to complementary invert the bits of the new data NewDat and to identify the bits in the complementary inverted new data that are different than the already stored bits in the memory location.

The decision calculator circuit CAL is configured to compute a first quantification (Q1) representing the duration of a first burst of bitwise programming operations corresponding to the bits of the new data NewDat respectively different than the bits of the former data; and to compute a second quantification (Q2) representing the duration of a second burst of bitwise programming operations corresponding to the bits of a complementary inversion of the new data NewDat, respectively different than the bits of the former data.

The decision calculator circuit CAL then compares the first quantification and the second quantification and sends a control signal to the programming circuit PROG to bitwise program the bits respectively different than the bits of the former data FormDat, belonging to the new data NewDat or belonging the complementary inversion of the new data NewDat, depending on the comparison result.

If the first quantification (Q1) is higher than the second quantification (Q2), the programming circuit PROG is configured to bitwise program the different bits of the complementary inversion of the new data NewDat (the second burst), together with programming or keeping the respective inversion flag InvFlg at the flagged value.

If the first quantification (Q1) is less than or equal to the second quantification (Q2), the programming circuit PROG is configured to bitwise program the different bits of the non-inverted new data NewDat (the first burst), together with programming or keeping the respective inversion flag InvFlg at the non-flagged value.

The programming of the inversion flag InvFlg depends on its previous state. The inversion flag InvFlg is to be programmed if its previous state is different than to the desired one. If the inversion flag was already programmed at the flagged value (resp. non-flagged value), then the inversion flag is not programmed in order to keep it at the flagged value (resp. non-flagged value).

Accordingly, the decision calculator circuit CAL is configured to control the programming circuit to perform the fastest programming operation between programming the non-inverted new data NewDat or programming the complementary inverted new data NewDat.

In order to compute the first quantification (Q1) and the second quantification (Q2), each representing the duration of the bitwise programming operations of the respective data, the differences in durations between setting a cell or resetting a cell may advantageously be taken into account.

The IC 100 may be part of a system including one or more processing devices, which may use the bitwise programmable memory to store data. As illustrated, the IC 100 is part of a system including a processor 110, which may be coupled to the DatMM 104, and which may be part of or separate from the integrated circuit 100

Figure 2:
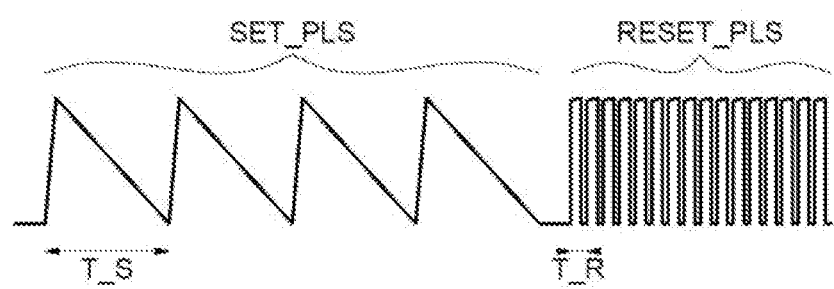
FIG. 2 is a conceptual diagram illustrating a series of set pulses SET_PLS, and a series of reset pulses RESET_PLS that can correspond to a burst of programming operations of some new data NewDat.

Reference is made to FIG. 2.

FIG. 2 illustrates a series of set pulses SET_PLS, and a series of reset pulses RESET_PLS that can correspond to a burst of programming operations of some new data NewDat.

More specifically, these set pulses SET_PLS and reset pulses RESET_PLS correspond to a programming operation of phase change memory "PCM," where the duration of a set pulse T_S is largely longer than the duration of a reset pulse T_R. For instance, the duration of a set pulse T_S can typically be equal to about 30, typically up to 60 times the duration of a reset pulse T_R.

Accordingly, the decision calculator circuit CAL may distinguish the duration of the set pulses T_S and of the reset pulses T_R, when computing the first quantification (Q1) and the second quantification (Q2).

This is in particular the case where the resistive memory cells were formed according to the absolute manner ("one cell one bit"), wherein each bitwise programming operation comprises using one set pulse SET_PLS having a set pulse duration T_S or using a reset pulse RESET_PLS having a different reset pulse duration T_R.

This case will be described later in relation with FIG. 3.

However, in the case where the resistive memory cells were formed according to the differential manner ("two cells one bit"), each bitwise programming operation comprises using both a set pulse SET_PLS and a reset pulse RESET_PLS. Indeed, programming a "1"="10" instead of a "0"="01," uses one set pulse "0_" to "1_" and one reset pulse "_1" to "_0," and vice versa.

Consequently, the duration of a programming operation is not dependent on the bit value ("0" or "1") to program.

Likewise, when the set pulse duration T_S and the reset pulse duration T_R are equal or almost equal, such as for example when the resistive memory is a magnetoresistive memory "MRAM," the duration of a programming operation is not dependent on the bit value ("0" or "1") to program.

In such cases, the decision calculator circuit CAL can be configured in an equivalent simpler manner, for testing the condition to program the non-inverted new data NewDat or the complementary inverted new data NewDat.

These cases will be described later in relation with FIG. 4.

Figure 3:
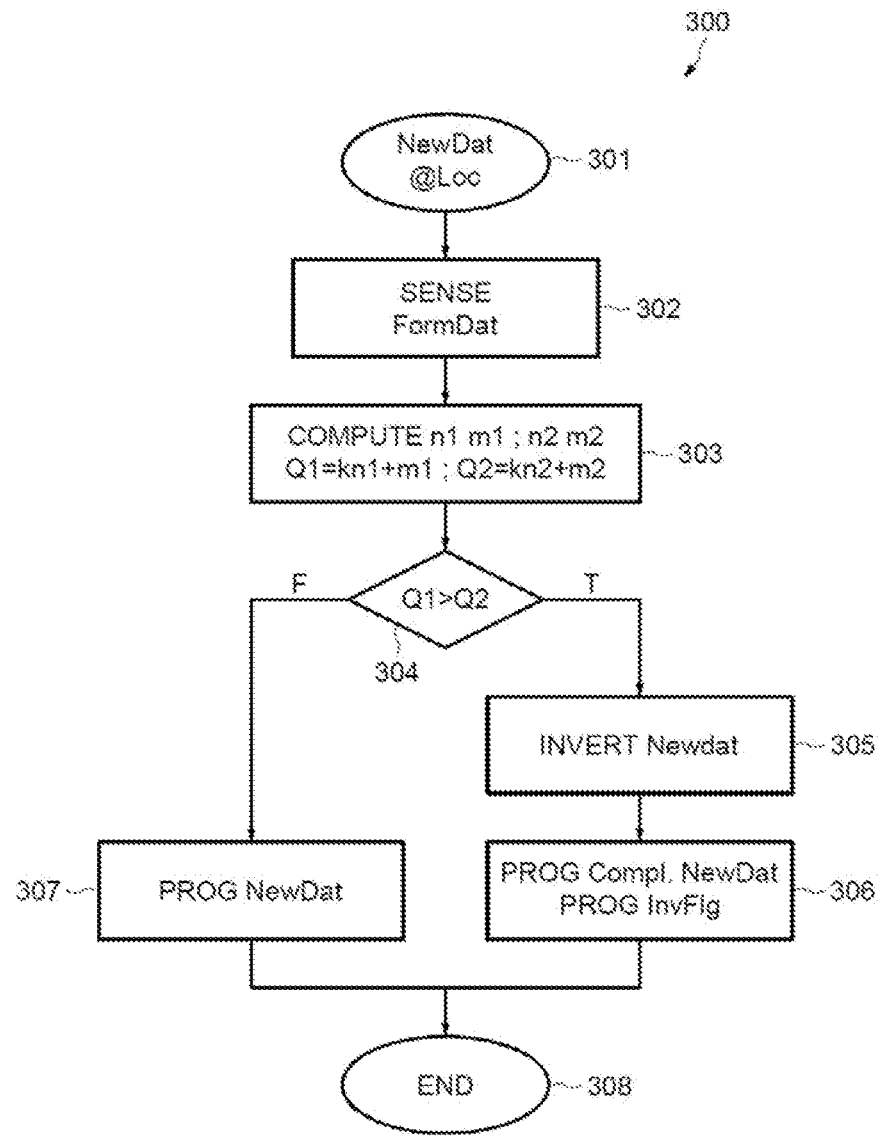
FIG. 3 illustrates an embodiment of a method of data management for bitwise programmable a non-volatile memory.

Reference is made to FIG. 3.

FIG. 3 illustrates a diagram depicting an embodiment of a method of data management 300 for bitwise programmable a non-volatile memory, such as a bitwise programmable memory as described before in relation with FIGS. 1 and 2.

The method 300 comprises, in response to receiving a command 301 including new data NewDat and the corresponding memory location Loc, a sensing step 302 sensing the former data FormDat stored in the memory location Loc, a decision step including a computing step 303, and a testing step 304.

The computing step 303 allows calculation of the first quantification Q1 representing the duration of the bitwise programming operations corresponding to the bits of the new data NewDat respectively different than the bits of the former data; and the second quantification Q2 representing the duration of the bitwise programming operations corresponding to the bits of a complementary inversion of the new data NewDat, respectively different than the bits of the former data.

For that purpose, the computing step 303 comprises counting the number of set pulses n1, n2 and the number of reset pulses m1, m2 amongst the respective bitwise programming operations.

Numbers having the suffix "1" (Q1, n1, m1) are related to the programming operations corresponding to the non-inverted new data NewDat, and numbers having the suffix "2" (Q2, n2, m2) are related to the programming operations corresponding to the complementary inverted new data NewDat.

Counting these numbers n1, m1, n2, m2 can for instance result from bitwise comparisons of the sensed former data FormDat with the new data NewDat, and with a complementary inverted copy of the new data NewDat.

The first and second quantification values Q1, Q2 are calculated to represent the accumulated durations of the respective bitwise programming operations, namely Q1=n1*T_S+m1*T_R and Q2=n2*T_S+m2*T_R.

Then, the calculations can both be simplified (or normalized) by the reset pulse duration T_R, so that Q1=k*n1+m1 and Q2=k*n2+m2, with k=T_S/T_R, since the quantifications are intended to be compared to each other.

The expressions of the first and second quantification values Q1=k*n1+m1, Q2=k*n2+m2 are thus proportional to the accumulated durations of the respective bitwise programming operations.

The testing step 304 compares the first and second quantifications Q1, Q2, more particularly it tests whether the first quantification Q1 is higher than the second quantification Q2.

If the result of the testing step 304 is true T, the method 300 comprises loading the complementary inversion 305 of the new data Compl.NewDat in programming registers, and a programming step 306 comprising bitwise programming the bits of the complementary inversion of the new data Compl.NewDat respectively different than the bits of the former data FormDat.

The programming step 306 also comprises programming the inversion flag InvFlg dedicated to the respective memory word at a flagged value, if necessary (if the inversion flag InvFlg was not already at the flagged value).

Then, the method 300 ends 308.

If the result of the testing step 304 is not true, e.g., false F, the programming step 307 comprises bitwise programming only of the bits of the non-inverted new data NewDat that are different than the respective bits of the former data FormDat.

The programming step 307 also comprises programming the inversion flag InvFlg dedicated to the respective memory word at a non-flagged value if necessary (if the inversion flag InvFlg was not already at the non-flagged value).

Then, the method 300 ends 308.

Advantageously, computing the first quantification Q1 and the second quantification Q2 takes into account the programming operation of the inversion flag InvFlg. That is to say, if the inversion flag InvFlg has the non-flagged value, the programming operation(s) to program the inversion flag InvFlg to the flagged value is counted in the second quantification Q2. Conversely, if the inversion flag InvFlg has the flagged value, the programming operation(s) to program the inversion flag InvFlg to the non-flagged value is counted in the first quantification Q1.

In addition, when the new value (flagged or non-flagged) of the inversion flag InvFlg is different than its previous value (reps. non-flagged or flagged), the new value of the inversion flag InvFlg not only impacts the isolated new data NewDat within the memory word WD, but impacts the entire data of the corresponding memory word.

The memory word is indeed not necessarily entirely composed of the new data NewDat at the memory location Loc, but can also comprise other former data outside of the memory location Loc.

Thus, when the inversion flag value changes, two cases are possible: the first case when the new data NewDat has a size equal or greater than the size of the memory word WD, and the second case when the new data NewDat has a size smaller than the size of the memory word WD.

In the first case, the memory word WD is entirely composed of the new data NewDat, and the inversion flag value InvFlg only impacts the inverted or non-inverted state of the new data NewDat. The aforementioned other former data outside of the memory location Loc do not exist and does not have to be taken into account.

In the second case, the memory word WD comprises both new data NewDat at the memory location Loc and other former data outside of the memory location Loc. The inversion flag value however impacts the inverted or non-inverted state of both the new data NewDat and all the bits belonging to the memory word WD outside of the memory location Loc. In order to cancel the impact of the inversion flag value InvFlg on the bits belonging to the memory word WD outside of the memory location Loc, all the bits belonging to the memory word WD outside of the memory location Loc are complementary inverted.

Thus, in the second case, computing the first quantification Q1 and the second quantification Q2 advantageously takes into account, namely in the counts n1, m1, n2, m2, the programming operations for inverting of all the other bits belonging to the memory word WD outside of the memory location Loc. The programming step 306 accordingly comprises programming all these other bits at their complementary inverted state, if the inversion flag InvFlg value has to change according to the results T, F of the testing step 304.

The method 300 is compatible with both cases of bit states—where the bit states are stored in an absolute manner ("one cell one bit") or in a differential manner ("two cells one bit").

However, when the bits states are stored in a differential manner ("two cells one bit"), or when the set pulse duration T_S and the reset pulse duration T_R are the same, it is possible to simplify, and thus possibly accelerate, the computing step 403, which will be described now.

Figure 4:
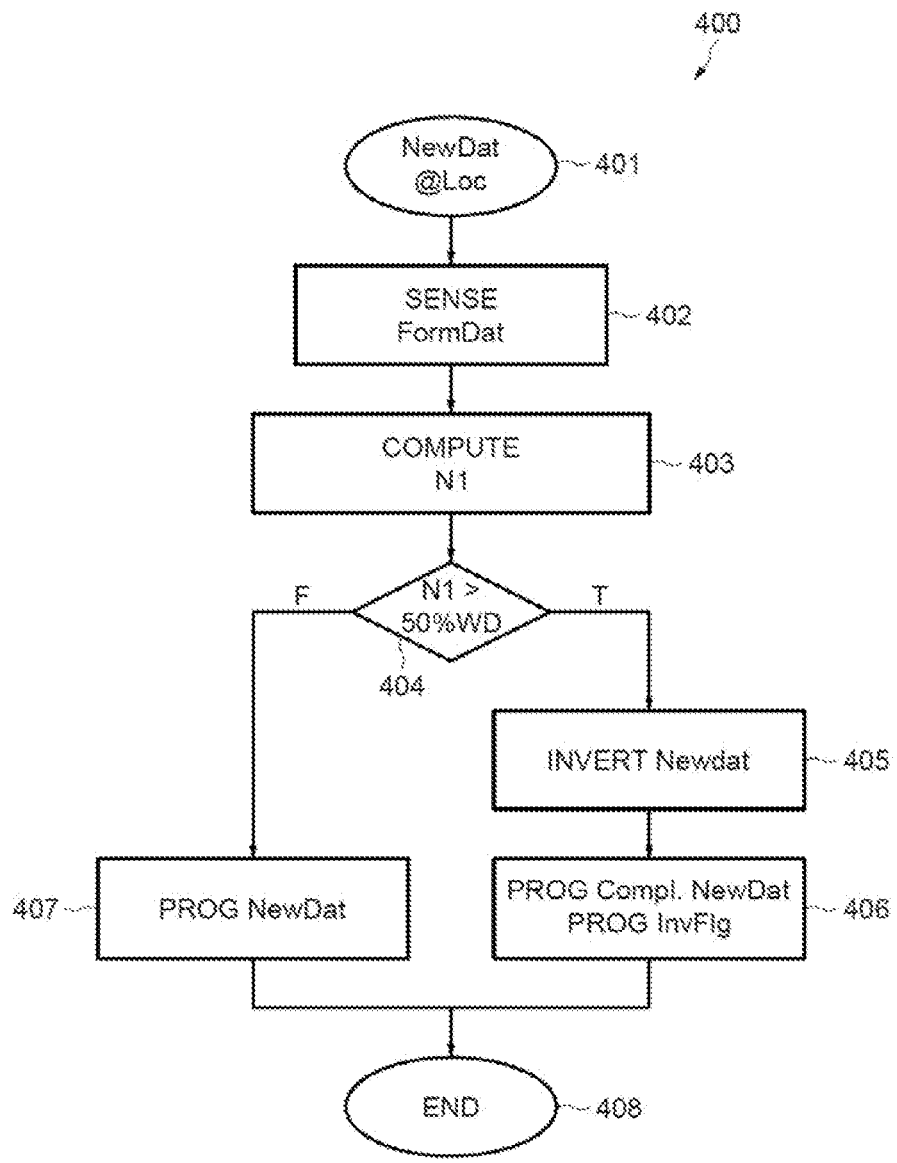
FIG. 4 illustrates an embodiment of a method of data management for bitwise programmable a non-volatile memory.

Reference is made to FIG. 4.

FIG. 4 illustrate a diagram of a method 400, similar to the method 300 described in reference to FIG. 3, where the computing step 403 and testing step 404 are simplified and optimized for cases where bits states are stored in a differential manner ("two cells one bit"), or when the set pulse duration T_S and the reset pulse duration T_R are the same.

The steps of receiving a command 401 and sensing the former data 402 are analogous to the steps 301 and 302 of the method 300.

The computing step 403 comprises counting an arbitrarily called "first number" N1 of the respectively different bits between the new data NewDat and the former data FormDat.

The testing step 404 tests whether the first number N1 is higher than 50% of the size of the memory word WD.

If the result of the testing step 404 is true T, the method 400 comprises a step of complementary inverting the new data 405 and a programming step 406 analogous to the steps 305 and 306 of the method 300, and the method 400 ends 408.

If the result of the testing step 404 is not true, e.g., false F, the method 400 comprises a programming step 407 analogous to the step 307 of the method 300, and the method 400 ends 408.

In other words, the method 400 corresponds to the method 300 wherein the decision step is replaced by an equivalent simplified decision step comprising counting the first number of respectively different bits between the new data and the former data, and testing whether the first number of respectively different bits is higher than 50% of the size of the memory word.

In fact, the method 400 is actually equivalent to the method 300, since, in the "two cells one bit" case, the number of set pulses is equal to the number of reset pulses, thus n1=m1(=N1), n2=m2(=N2).

Consequently, the first and second quantifications according to the method 300 are expressed Q1=(k+1)*N1 and Q2=(k+1)*N2. Comparing Q1 to Q2 remains the same by simplifying by k+1, and then Q1=N1 while Q2=N2.

Finally, with S the size of the memory word WD, N1+N2=S according to the complementary nature of N1 and N2 within the memory word WD. Consequently, Q1>Q2 when N1>S/2.

Figure 5:
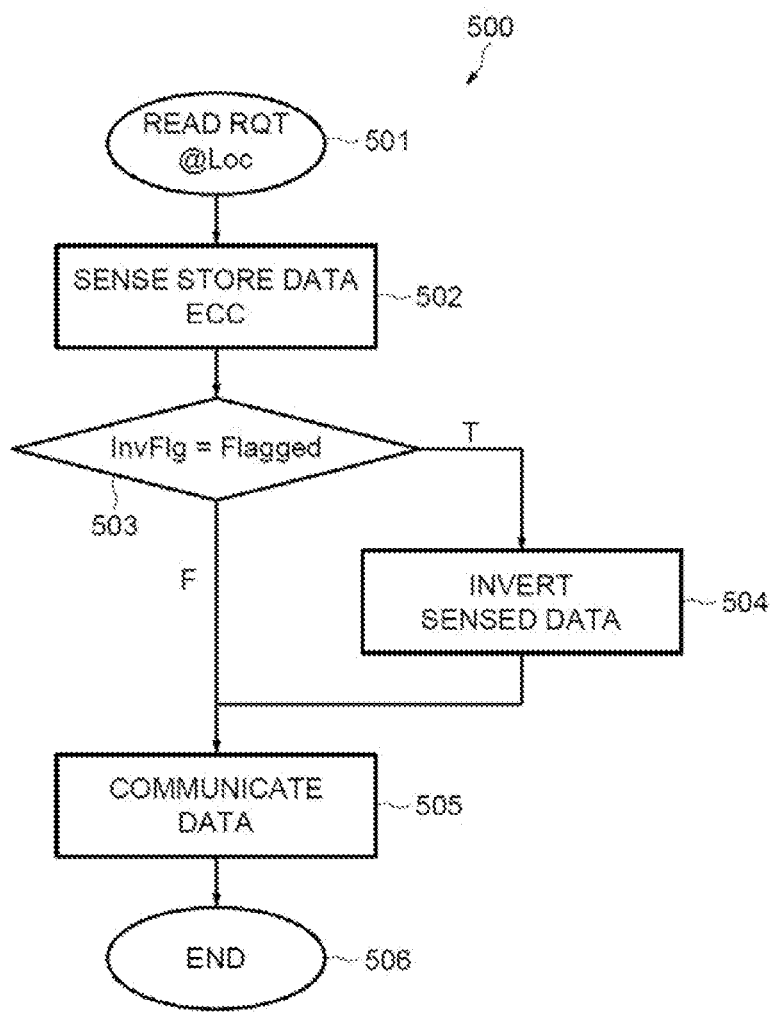
FIG. 5 illustrates an embodiment of a method of data management for bitwise reading a non-volatile memory.

FIG. 5 illustrates a diagram of a reading process 500, for example, to read data programmed in the method of data management 300, 400 previously described.

In response to a read request 501 of data stored at a memory location Loc of a memory word, the reading process 500 comprises sensing 502 the bits of the data stored in the memory location and sensing the inversion flag InvFlg. Care may be taken in case of using error correction code algorithm ECC, which should advantageously be executed both on the sensed data and on the inversion flag InvFlg, before a possible inversion 504 of the bit states of the sensed data.

If the inversion flag InvFlg dedicated to the memory word has the flagged value 503-T, the reading process 500 comprises inverting 504 each bit of the sensed data to the respective complementary bits before communicating 505 the read data.

If the inversion flag InvFlg dedicated to the memory word has the non-flagged value 503-F, the reading process 500 classically senses the data in their non-inverted state, and does not invert the bits of the sensed data before communicating 505 the read data.

Then, the method 500 can end 506.

Figure 6:
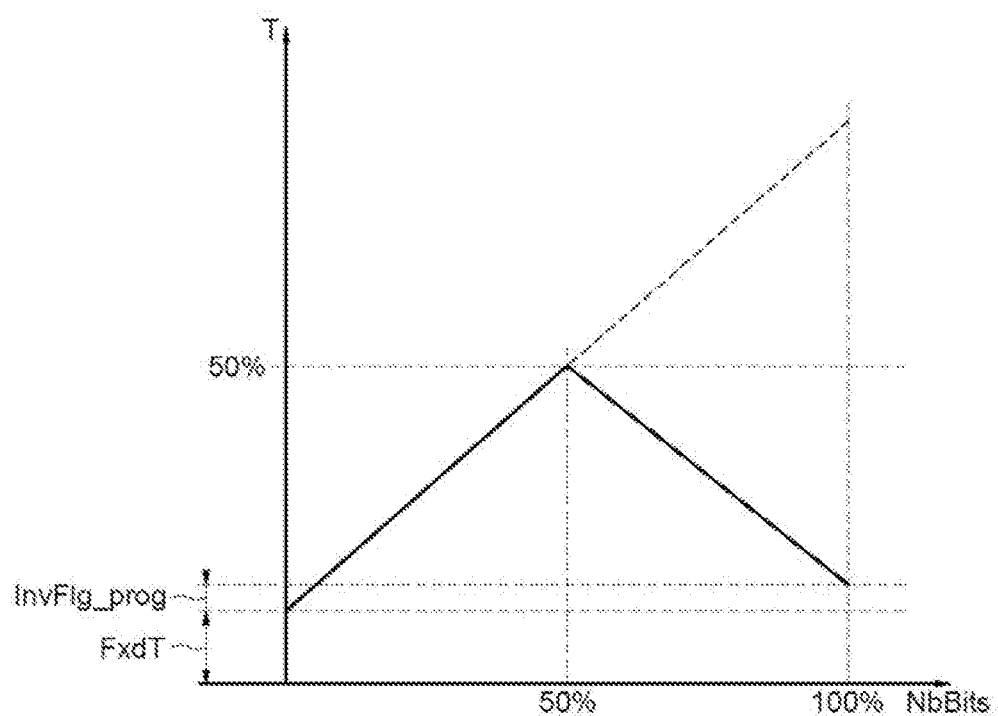
FIG. 6 illustrates an example timing diagram of an embodiment.

FIG. 6 illustrates a graph showing examples of a time gain provided by the embodiments described in relation with FIGS. 1 to 5.

The graph shows the time duration T of the storing process respective to the number of bits to change NbBits with respect to the former data to result in the new data, for a classical case indicated by a dotted line and for embodiments described in relation with FIGS. 1 to 5, indicated by a solid line.

As indicated by the dotted line, for the classical case, the time duration T increases proportionally to the number of bits to change NbBits, to which a fixed time cost FxdT is added.

As indicated by the solid line, for the described embodiments, the time duration T increases proportionally to the number of bits to change NbBits, at a rate identical to that of the classical case, until about 50% of bits to change in the memory word. Above 50% of bits to change, the new data is complementary inverted, and the more bits are initially different in the initial new data, the less bits are different in the complementary inverted new data. Thus, the time duration T decreases from about 50% of the classical time range, until the initial fixed time cost FxdT plus the inversion flag programming time InvFlg_grog is reached.

However, despite this arbitrary representation of the graph, the inversion flag InvFlg programming time InvFlg_grog has to be considered depending on the previous state of the inversion flag InvFlg. Indeed, depending on the previous state of the inversion flag InvFlg, the cost of the inversion flag InvFlg programming time could be worthwhile in the case of no inversion on the new data NewDat or not worthwhile in case of inversion of the new data NewDat.

In fact, the graph of FIG. 6 corresponds to the embodiment when there is no time difference between programming a "1" and programming a "0" in the resistive memory cells, as described in relation with FIG. 4.

In the embodiment described in relation with FIG. 3, the gain can be improved for less than 50% of bits to change in the initial new data.

For example, when programming a complete 32 bit length memory word, using the notations Q1=k*n1+m1 and Q2=k*n2+m2, with n1 the number of set pulses needed to program the non-inverted new data, m1 the number of reset pulses needed to program the non-inverted new data, n2 the number of set pulses needed to program the inverted new data, m2 the number of reset pulses needed to program the inverted new data, and k=10, where:

00001111 00001111 00001111 00001111+0=FormDat+InvFlg

1<u>1</u>0<u>1</u>1<u>111</u> <u>11111111</u> <u>111</u>0<u>1111</u> <u>11111111</u>+0=NewDat+InvFlg

00<u>1</u>00000 00000000 000<u>1</u>0000 0000000<u>0</u>+1=Compl.NewDat+InvFlg the underlined bits correspond to the pulses needed in each case;

n1=14; m1=0; Q1=10*14+0=140 n2=3; m2=16; Q2=10*3+16=46.

In this example, even if the absolute number of indistinct pulses needed for programming the inverted new data is larger than the absolute number of pulses for programming the non-inverted new data, the duration of the operation in case of inversing of the data is about 30% of the duration in case of no inversion. In other words, Q1 can be larger than Q2 even if the number of the bits that changes is greater in the case of inversion than in the case without inversion.

A method of data management (300) for a bitwise programmable non-volatile memory, may be summarized as including storing new data (NewDat) at a memory location (Loc) of a memory word, said storing including a sensing step (302) sensing former data (FormDat) stored in the memory location; a decision step including computing (303) a first quantification (Q1) of a first burst of bitwise programming operations corresponding to the bits of the new data (NewDat) respectively different than the bits of the former data (FormDat), computing (303) a second quantification (Q2) of a second burst of bitwise programming operations corresponding to the bits of a complementary inversion of the new data (Compl.NewDat), respectively different than the bits of the former data (FormDat), testing (304) whether the first quantification (Q1) is higher than the second quantification (Q2); and a programming step (306) including, if the test of the decision step is true (T), bitwise programming the bits of the complementary inversion (305) of the new data (Compl.NewDat) respectively different than the bits of the former data (FormDat), and programming or keeping an inversion flag (InvFlg) dedicated to the memory word at a flagged value.

Each bitwise programming operation may include using a set pulse (SET_PLS) having a set pulse duration (T_S) or using a reset pulse (RESET_PLS) having a reset pulse duration (T_R), and wherein computing the first quantification (Q1) and the second quantification (Q2) each may include counting the number of set pulses (n1; n2) and of resets pulses (m1; m2) among the respective first burst and second burst of bitwise programming operations, and calculating the respective quantification values (Q1; Q2) proportional to the accumulated durations (kn1+m1; kn2+m2) of the bitwise programming operations in each respective burst.

Computing the first quantification (Q1) and the second quantification (Q2) may take into account the programming operation of the inversion flag (InvFlg).

When the memory location size (Loc) may be smaller than the memory word size (WD) and when the inversion flag (InvFlg) dedicated to the memory word (WD) may have to be programmed, computing the first quantification (Q1) and the second quantification (Q2) may take into account the programming operations for inverting of all the other bits belonging to the memory word (WD) outside of the memory location (Loc); and the programming step (306) comprises programming all these other bits at their complementary inverted state.

Each bit state may be stored in an absolute manner having a set state or a reset state.

Each bit state may be stored in a differential manner using an oriented pair of complementary states, each programming operation may include using both a set pulse (SET_PLS) and a reset pulse (RESET_PLS), and wherein the decision step may be replaced by an equivalent simplified decision step including counting (403) a first number (N1) of respectively different bits between the new data (NewDat) and the former data (FormDat), and testing (404) whether the first number (N1) is higher than 50% of the size of the memory word (WD).

The method may include reading data (500) stored at a memory location (Loc) of a memory word, the reading may include sensing the bits of the data stored in the memory location (502) and, if the inversion flag (InvFlg) dedicated to the memory word has the flagged value (503, T), inverting (504) each bit of the sensed data to the respective complementary bits.

Sensing data (502) may include an error correction code algorithm (ECC) performed on the data stored in the memory word (WD) and on the dedicated inversion flag (InvFlg), and executed before inverting (504) the bit states of the sensed data.

The programming step (307) may include, if the test of the computing step is not true (F), bitwise programming only the bits of the new data (NewDat) that may be different than the respective bits of the former data (FormDat), together with programming or keeping the inversion flag (InvFlg) dedicated to the memory word at a non-flagged value.

An integrated circuit including a bitwise programmable non-volatile memory (IC), may be summarized as including data management means (DatMM) configured to store new data (NewDat) at a memory location (Loc) of a memory word (WD), said data management means including a sensing circuit (SNS) configured to sense former data stored in the memory location (Loc); a decision calculator circuit (CAL) configured to compute a first quantification of a first burst of bitwise programming operations corresponding to the bits of the new data (NewDat) respectively different than the bits of the former data, to compute a second quantification of a second burst of bitwise programming operations corresponding to the bits of a complementary inversion of the new data (NewDat), respectively different than the bits of the former data, to test whether the first quantification is higher than the second quantification; and a programming circuit (PROG) configured, if the test of the decision calculator circuit (CAL) is true, to bitwise program the bits of the complementary inversion of the new data (NewDat) respectively different than the bits of the former data, and to program or to keep an inversion flag dedicated (InvFlg) to the memory word (WD) at a flagged value.

The programming circuit (PROG) may be configured, for each bitwise programming operation, to use a set pulse (SET_PLS) having a set pulse duration (T_S) or a reset pulse (RESET_PLS) having a reset pulse duration (T_R), and wherein the decision calculator circuit (CAL) may be configured, for computing the first quantification (Q1) and the second quantification (Q2), to count the number of set pulses (n1, n2) and of resets pulses (m1, m2) among the respective first burst and second burst of bitwise programming operations, and to calculate the respective quantification values (Q1, Q2) proportional to the accumulated durations (kn1+m1; kn2+m2) of the bitwise programming operations in each respective burst.

The decision calculator circuit (CAL) may be configured to compute the first quantification (Q1) and the second quantification (Q2) taking into account the programming operation of the inversion flag (InvFlg).

When the memory location size (Loc) is smaller than the memory word size (WD) and when the inversion flag (InvFlg) dedicated to the memory word (WD) has to be programmed, the decision calculator circuit (CAL) may be configured to compute the first quantification (Q1) and the second quantification (Q2) taking into account the programming operations for inverting of all the other bits belonging to the memory word (WD) outside of the memory location (Loc); and the programming circuit (PROG) may be configured to program all these other bits at their complementary inverted state.

The non-volatile memory may be configured to store each bit state in an absolute cell adapted to have a set state or a reset state.

The non-volatile memory may be configured to store each bit state in a pair of differential cells adapted to store an oriented pair of complementary states, the programming circuit (PROG) being configured to use both a set pulse (SET_PLS) and a reset pulse (RESET_PLS) for each bitwise programming operation, and wherein the configuration of the decision calculator circuit (CAL) may be replaced by an equivalent simplified configuration adapted to count a first number (N1) of respectively different bits between the new data (NewDat) and the former data (FromDat), and to test whether the first number (N1) is higher than 50% of the size of the memory word (WD).

The data management means (DatMM) may include a reading circuit (RD) configured to sense the bits of the data stored at a memory location (Loc) of a memory word (WD), and, if the inversion flag (InvFlg) dedicated to the memory word (WD) has the flagged value, to invert each of the sensed bit to the respective complementary bit.

The reading circuit (RD) may include an error correction code mechanism (ECC) configured to be performed on the data stored in the memory word (WD) and on the dedicated inversion flag (InvFlg), and to be executed before inverting the sensed bits.

The programming circuit (PROG) may be configured, if the test of the decision calculator circuit (CAL) is not true, to bitwise program only the bits of the new data (NewDat) that may be different than the respective bits of the former data (FormDat), together with programming or keeping the inversion flag (InvFlg) dedicated to the memory word (WD) at a non-flagged value.

In an embodiment, a method comprises: receiving a request to store new data at a memory location of a bitwise programmable non-volatile memory; sensing data stored at the memory location of the bitwise programmable memory; comparing bits of the sensed data with bits of the new data; generating an indication of a cost difference between: a first burst of bitwise programming operations associated with programming bits of the new data which are different from bits of the sensed data; and a second burst of bitwise programming operations associated with programming bits of a complementary inversion of the new data which are different from bits of the sensed data; and executing one of the first burst of bitwise programming operations or the second burst of bitwise programming operations based on the generated indication of the cost difference. In an embodiment, the method comprises: generating a first quantification of the first burst of bitwise programming operations; generating a second quantification of the second burst of bitwise programming operations; comparing the first quantification to the second quantification; and executing one of the first burst of bitwise programming operations or the second burst of bitwise programming operations based on the comparing of the first quantification to the second quantification. In an embodiment, a bitwise programming operation comprises using a set pulse having a set pulse duration or using a reset pulse having a reset duration; generating the first quantification comprises determining a number of set pulses and a number of reset pulses associated with the first burst of bitwise programming operations, and determining an accumulated duration of time associated with the first burst of bitwise programming operations based on the number of set pulses and the number of reset pulses associated with the first burst of bitwise programming operations; and generating the second quantification comprises determining a number of set pulses and a number of reset pulses associated with the second burst of bitwise programming operations, and determining an accumulated duration of time associated with the second burst of bitwise programming operations based on the number of set pulses and the number of reset pulses associated with the second burst of bitwise programming operations. In an embodiment, the generating the indication of the cost difference takes into account programming operations associated with programming of an inversion flag. In an embodiment, when a size of the memory location is smaller than a size of a memory word including the memory location, and an inversion flag associated with the memory word has to be programmed, the cost difference takes into account programming operations for inverting of all the other bits belonging to the memory word outside of the memory location, and the programming burst comprises programming all the other bits at a complementary inverted state. In an embodiment, a bit state is stored in an absolute manner having a set state or a reset state. In an embodiment, a bit state is stored in a differential manner using an oriented pair of complementary states; a programming operation comprises using both a set pulse and a reset pulse; and the generating the indication of the cost difference comprises: counting a number of different bits between the new data and the sensed data; and determining whether the number of different bits between the new data and the sensed data is higher than 50% of a size of a memory word of the bitwise programmable memory. In an embodiment, the method comprises reading data stored at a memory location of a memory word, the reading comprising sensing bits of data stored in the memory location and, if an inversion flag associated with the memory word has a flagged value, inverting each bit of the sensed data to a respective complementary bit. In an embodiment, sensing data comprises applying an error correction code algorithm on the data stored in the memory word and on the inversion flag before inverting the bit states of the sensed data. In an embodiment, the first burst of programming operations comprises bitwise programming only the bits of the new data that are different than the respective bits of the sensed data, together with programming or keeping an inversion flag dedicated to the memory word at a non-flagged value.

In an embodiment, a device comprises: a bitwise programmable non-volatile memory array; and memory management circuitry coupled to the bitwise programmable memory array, wherein the memory management circuitry, in operation: receives a request to store new data at a memory location of the bitwise programmable non-volatile memory array; senses data stored at the memory location of the bitwise programmable memory array; compares bits of the sensed data with bits of the new data; generates an indication of a cost difference between: a first burst of bitwise programming operations associated with programming bits of the new data which are different from bits of the sensed data; and a second burst of bitwise programming operations associated with programming bits of a complementary inversion of the new data which are different from bits of the sensed data; and executes one of the first burst of bitwise programming operations or the second burst of bitwise programming operations based on the generated indication of the cost difference. In an embodiment, the memory management circuitry, in operation: generates a first quantification of the first burst of bitwise programming operations; generates a second quantification of the second burst of bitwise programming operations; compares the first quantification to the second quantification; and executes one of the first burst of bitwise programming operations or the second burst of bitwise programming operations based on the comparing of the first quantification to the second quantification. In an embodiment, a bitwise programming operation comprises using a set pulse having a set pulse duration or using a reset pulse having a reset duration; generating the first quantification comprises determining a number of set pulses and a number of reset pulses associated with the first burst of bitwise programming operations, and determining an accumulated duration of time associated with the first burst of bitwise programming operations based on the number of set pulses and the number of reset pulses associated with the first burst of bitwise programming operations; and generating the second quantification comprises determining a number of set pulses and a number of reset pulses associated with the second burst of bitwise programming operations, and determining an accumulated duration of time associated with the second burst of bitwise programming operations based on the number of set pulses and the number of reset pulses associated with the second burst of bitwise programming operations. In an embodiment, the generating the indication of the cost difference takes into account programming operations associated with programming of an inversion flag. In an embodiment, when a size of the memory location is smaller than a size of a memory word including the memory location, and an inversion flag associated with the memory word has to be programmed, the cost difference takes into account programming operations for inverting of all the other bits belonging to the memory word outside of the memory location, and the programming burst comprises programming all the other bits at a complementary inverted state. In an embodiment, a bit state is stored in an absolute manner having a set state or a reset state. In an embodiment, a bit state is stored in a differential manner using an oriented pair of complementary states; a programming operation comprises using both a set pulse and a reset pulse; and the generating the indication of the cost difference comprises: counting a number of different bits between the new data and the sensed data; and determining whether the number of different bits between the new data and the sensed data is higher than 50% of a size of a memory word of the bitwise programmable memory including the memory location. In an embodiment, the memory management circuitry, in operation, responds to a request to read data stored at a memory location of a memory word by sensing bits of data stored in the memory location and, if an inversion flag associated with the memory word has a flagged value, inverting each bit of the sensed data to a respective complementary bit. In an embodiment, the memory management circuitry, in operation, applies an error correction code algorithm on the data stored in the memory word and on the inversion flag before inverting the bit states of the sensed data. In an embodiment, the first burst of programming operations comprises bitwise programming only the bits of the new data that are different than the respective bits of the sensed data, together with programming or keeping an inversion flag dedicated to the memory word at a non-flagged value.

In an embodiment, a system, comprises: a processing device; and a bitwise programmable non-volatile memory coupled to the processing device and including memory management circuitry. The memory management circuitry, in operation, responds to a request from the processing device to store new data at a memory location of the bitwise programmable non-volatile memory by; sensing data stored at the memory location of the bitwise programmable memory; comparing bits of the sensed data with bits of the new data; generating an indication of a cost difference between: a first burst of bitwise programming operations associated with programming bits of the new data which are different from bits of the sensed data; and a second burst of bitwise programming operations associated with programming bits of a complementary inversion of the new data which are different from bits of the sensed data; and executing one of the first burst of bitwise programming operations or the second burst of bitwise programming operations based on the generated indication of the cost difference. In an embodiment, the memory management circuitry, in operation: generates a first quantification of the first burst of bitwise programming operations; generates a second quantification of the second burst of bitwise programming operations; compares the first quantification to the second quantification; and executes one of the first burst of bitwise programming operations or the second burst of bitwise programming operations based on the comparing of the first quantification to the second quantification. In an embodiment, a bitwise programming operation comprises using a set pulse having a set pulse duration or using a reset pulse having a reset duration; generating the first quantification comprises determining a number of set pulses and a number of reset pulses associated with the first burst of bitwise programming operations, and determining an accumulated duration of time associated with the first burst of bitwise programming operations based on the number of set pulses and the number of reset pulses associated with the first burst of bitwise programming operations; and generating the second quantification comprises determining a number of set pulses and a number of reset pulses associated with the second burst of bitwise programming operations, and determining an accumulated duration of time associated with the second burst of bitwise programming operations based on the number of set pulses and the number of reset pulses associated with the second burst of bitwise programming operations. In an embodiment, when a size of the memory location is smaller than a size of a memory word including the memory location, and an inversion flag associated with the memory word has to be programmed, the cost difference takes into account programming operations for inverting of all the other bits belonging to the memory word outside of the memory location, and the programming burst comprises programming all the other bits at a complementary inverted state. In an embodiment, a bit state is stored in a differential manner using an oriented pair of complementary states; a programming operation comprises using both a set pulse and a reset pulse; and the generating the indication of the cost difference comprises: counting a number of different bits between the new data and the sensed data; and determining whether the number of different bits between the new data and the sensed data is higher than 50% of a size of a memory word of the bitwise programmable memory including the memory location.

In an embodiment, a non-transitory computer-readable medium's contents cause a memory management circuit to perform a method, the method comprising: receiving a request to store new data at a memory location of a bitwise programmable non-volatile memory; sensing data stored at the memory location of the bitwise programmable memory; comparing bits of the sensed data with bits of the new data; generating an indication of a cost difference between: a first burst of bitwise programming operations associated with programming bits of the new data which are different from bits of the sensed data; and a second burst of bitwise programming operations associated with programming bits of a complementary inversion of the new data which are different from bits of the sensed data; and executing one of the first burst of bitwise programming operations or the second burst of bitwise programming operations based on the generated indication of the cost difference. In an embodiment, when a size of the memory location is smaller than a size of a memory word including the memory location, and an inversion flag associated with the memory word has to be programmed, the cost difference takes into account programming operations for inverting of all the other bits belonging to the memory word outside of the memory location, and the programming burst comprises programming all the other bits at a complementary inverted state. In an embodiment, the contents comprise instructions executed by the memory management circuitry.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), state machines, etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A method, comprising:
receiving a request to store new data at a memory location of a bitwise programmable non-volatile memory;
sensing data stored at the memory location of the bitwise programmable memory;
comparing bits of the sensed data with bits of the new data;

generating an indication of a cost difference between:
  a first burst of bitwise programming operations associated with programming bits of the new data which are different from bits of the sensed data; and
  a second burst of bitwise programming operations associated with programming bits of a complementary inversion of the new data which are different from bits of the sensed data; and
executing one of the first burst of bitwise programming operations or the second burst of bitwise programming operations based on the generated indication of the cost difference, wherein, when a size of the memory location is smaller than a size of a memory word including the memory location, and an inversion flag associated with the memory word has to be programmed, the cost difference takes into account programming operations for inverting of all the other bits belonging to the memory word outside of the memory location, and the programming burst comprises programming all the other bits at a complementary inverted state.

2. The method of claim 1, comprising:
generating a first quantification of the first burst of bitwise programming operations;
generating a second quantification of the second burst of bitwise programming operations;
comparing the first quantification to the second quantification; and
executing one of the first burst of bitwise programming operations or the second burst of bitwise programming operations based on the comparing of the first quantification to the second quantification.

3. The method according to claim 2, wherein,
a bitwise programming operation comprises using a set pulse having a set pulse duration or using a reset pulse having a reset duration;
generating the first quantification comprises determining a number of set pulses and a number of reset pulses associated with the first burst of bitwise programming operations, and determining an accumulated duration of time associated with the first burst of bitwise programming operations based on the number of set pulses and the number of reset pulses associated with the first burst of bitwise programming operations; and
generating the second quantification comprises determining a number of set pulses and a number of reset pulses associated with the second burst of bitwise programming operations, and determining an accumulated duration of time associated with the second burst of bitwise programming operations based on the number of set pulses and the number of reset pulses associated with the second burst of bitwise programming operations.

4. The method according to claim 1, wherein the generating the indication of the cost difference takes into account programming operations associated with programming of an inversion flag.

5. The method according to claim 1, wherein, when a size of the memory location is smaller than a size of a memory word including the memory location, and an inversion flag associated with the memory word does not have to be programmed, the cost difference does not take into account programming operations for inverting of all the other bits belonging to the memory word outside of the memory location.

6. The method according to claim 1, wherein a bit state is stored in an absolute manner having a set state or a reset state.

7. The method according to claim 1, wherein:
a bit state is stored in a differential manner using an oriented pair of complementary states;
a programming operation comprises using both a set pulse and a reset pulse; and
the generating the indication of the cost difference comprises:
  counting a number of different bits between the new data and the sensed data; and
  determining whether the number of different bits between the new data and the sensed data is higher than 50% of a size of a memory word of the bitwise programmable memory.

8. The method according to claim 1, comprising reading data stored at a memory location of a memory word, the reading comprising sensing bits of data stored in the memory location and, if an inversion flag associated with the memory word has a flagged value, inverting each bit of the sensed data to a respective complementary bit.

9. The method according to claim 8, wherein sensing data comprises applying an error correction code algorithm on the data stored in the memory word and on the inversion flag before inverting the bit states of the sensed data.

10. The method according to claim 1, wherein, the first burst of programming operations comprises bitwise programming only the bits of the new data that are different than the respective bits of the sensed data, together with programming or keeping an inversion flag dedicated to the memory word at a non-flagged value.

11. A device, comprising:
a bitwise programmable non-volatile memory array; and
memory management circuitry coupled to the bitwise programmable memory array, wherein the memory management circuitry, in operation:
  receives a request to store new data at a memory location of the bitwise programmable non-volatile memory array;
  senses data stored at the memory location of the bitwise programmable memory array;
  compares bits of the sensed data with bits of the new data;
  generates an indication of a cost difference between:
    a first burst of bitwise programming operations associated with programming bits of the new data which are different from bits of the sensed data; and
    a second burst of bitwise programming operations associated with programming bits of a complementary inversion of the new data which are different from bits of the sensed data; and
  executes one of the first burst of bitwise programming operations or the second burst of bitwise programming operations based on the generated indication of the cost difference wherein, when a size of the memory location is smaller than a size of a memory word including the memory location, and an inversion flag associated with the memory word has to be programmed, the cost difference takes into account programming operations for inverting of all the other bits belonging to the memory word outside of the memory location, and the programming burst comprises programming all the other bits at a complementary inverted state.

12. The device of claim 11, wherein the memory management circuitry, in operation:
generates a first quantification of the first burst of bitwise programming operations;

generates a second quantification of the second burst of bitwise programming operations;
compares the first quantification to the second quantification; and
executes one of the first burst of bitwise programming operations or the second burst of bitwise programming operations based on the comparing of the first quantification to the second quantification.

13. The device according to claim 12, wherein,
a bitwise programming operation comprises using a set pulse having a set pulse duration or using a reset pulse having a reset duration;
generating the first quantification comprises determining a number of set pulses and a number of reset pulses associated with the first burst of bitwise programming operations, and determining an accumulated duration of time associated with the first burst of bitwise programming operations based on the number of set pulses and the number of reset pulses associated with the first burst of bitwise programming operations; and
generating the second quantification comprises determining a number of set pulses and a number of reset pulses associated with the second burst of bitwise programming operations, and determining an accumulated duration of time associated with the second burst of bitwise programming operations based on the number of set pulses and the number of reset pulses associated with the second burst of bitwise programming operations.

14. The device according to claim 11, wherein the generating the indication of the cost difference takes into account programming operations associated with programming of an inversion flag.

15. The device according to claim 11, wherein, when a size of the memory location is smaller than a size of a memory word including the memory location, and an inversion flag associated with the memory word does not have to be programmed, the cost difference does not take into account programming operations for inverting of all the other bits belonging to the memory word outside of the memory location.

16. The device according to claim 11, wherein a bit state is stored in an absolute manner having a set state or a reset state.

17. The device according to claim 11, wherein:
a bit state is stored in a differential manner using an oriented pair of complementary states;
a programming operation comprises using both a set pulse and a reset pulse; and
the generating the indication of the cost difference comprises:
counting a number of different bits between the new data and the sensed data; and
determining whether the number of different bits between the new data and the sensed data is higher than 50% of a size of a memory word of the bitwise programmable memory including the memory location.

18. The device according to claim 11, wherein the memory management circuitry, in operation, responds to a request to read data stored at a memory location of a memory word by sensing bits of data stored in the memory location and, if an inversion flag associated with the memory word has a flagged value, inverting each bit of the sensed data to a respective complementary bit.

19. The device according to claim 18, wherein the memory management circuitry, in operation, applies an error correction code algorithm on the data stored in the memory word and on the inversion flag before inverting the bit states of the sensed data.

20. The device according to claim 11, wherein, the first burst of programming operations comprises bitwise programming only the bits of the new data that are different than the respective bits of the sensed data, together with programming or keeping an inversion flag dedicated to the memory word at a non-flagged value.

21. A system, comprising:
a processing device; and
a bitwise programmable non-volatile memory coupled to the processing device and including memory management circuitry, wherein the memory management circuitry, in operation, responds to a request from the processing device to store new data at a memory location of the bitwise programmable non-volatile memory by:
sensing data stored at the memory location of the bitwise programmable memory;
comparing bits of the sensed data with bits of the new data;
generating an indication of a cost difference between:
a first burst of bitwise programming operations associated with programming bits of the new data which are different from bits of the sensed data; and
a second burst of bitwise programming operations associated with programming bits of a complementary inversion of the new data which are different from bits of the sensed data; and
executing one of the first burst of bitwise programming operations or the second burst of bitwise programming operations based on the generated indication of the cost difference wherein, when a size of the memory location is smaller than a size of a memory word including the memory location, and an inversion flag associated with the memory word has to be programmed, the cost difference takes into account programming operations for inverting of all the other bits belonging to the memory word outside of the memory location, and the programming burst comprises programming all the other bits at a complementary inverted state.

22. The system of claim 21, wherein the memory management circuitry, in operation:
generates a first quantification of the first burst of bitwise programming operations;
generates a second quantification of the second burst of bitwise programming operations;
compares the first quantification to the second quantification; and
executes one of the first burst of bitwise programming operations or the second burst of bitwise programming operations based on the comparing of the first quantification to the second quantification.

23. The system according to claim 22, wherein,
a bitwise programming operation comprises using a set pulse having a set pulse duration or using a reset pulse having a reset duration;
generating the first quantification comprises determining a number of set pulses and a number of reset pulses associated with the first burst of bitwise programming operations, and determining an accumulated duration of time associated with the first burst of bitwise programming operations based on the number of set pulses and the number of reset pulses associated with the first burst of bitwise programming operations; and generating the second quantification comprises determining a number of set pulses and a number of reset pulses associated with the second burst of bitwise programming operations, and determining an accumulated duration of time associated with the second burst of bitwise programming operations based on the number of set pulses and the number of reset pulses associated with the second burst of bitwise programming operations.

24. The system according to claim 21, wherein, when a size of the memory location is smaller than a size of a memory word including the memory location, and an inversion flag associated with the memory word does not have to be programmed, the cost difference does not take into account programming operations for inverting of all the other bits belonging to the memory word outside of the memory location.

25. The system according to claim 21, wherein:
a bit state is stored in a differential manner using an oriented pair of complementary states;
a programming operation comprises using both a set pulse and a reset pulse; and
the generating the indication of the cost difference comprises:
counting a number of different bits between the new data and the sensed data; and
determining whether the number of different bits between the new data and the sensed data is higher than 50% of a size of a memory word of the bitwise programmable memory including the memory location.

26. A non-transitory computer-readable medium having contents which cause a memory management circuit to perform a method, the method comprising:
receiving a request to store new data at a memory location of a bitwise programmable non-volatile memory;
sensing data stored at the memory location of the bitwise programmable memory;
comparing bits of the sensed data with bits of the new data;
generating an indication of a cost difference between:
a first burst of bitwise programming operations associated with programming bits of the new data which are different from bits of the sensed data; and
a second burst of bitwise programming operations associated with programming bits of a complementary inversion of the new data which are different from bits of the sensed data; and
executing one of the first burst of bitwise programming operations or the second burst of bitwise programming operations based on the generated indication of the cost difference, wherein, when a size of the memory location is smaller than a size of a memory word including the memory location, and an inversion flag associated with the memory word has to be programmed, the cost difference takes into account programming operations for inverting of all the other bits belonging to the memory word outside of the memory location, and the programming burst comprises programming all the other bits at a complementary inverted state.

27. The non-transitory computer-readable medium of claim 26, wherein, when a size of the memory location is smaller than a size of a memory word including the memory location, and an inversion flag associated with the memory word does not have to be programmed, the cost difference does not take into account programming operations for inverting of all the other bits belonging to the memory word outside of the memory location.

28. The non-transitory computer-readable medium of claim 26 wherein the contents comprise instructions executed by the memory management circuitry.

\* \* \* \* \*